United States Patent [19]

Nath

[11] Patent Number: 4,605,565
[45] Date of Patent: Aug. 12, 1986

[54] METHOD OF DEPOSITING A HIGHLY CONDUCTIVE, HIGHLY TRANSMISSIVE FILM

[75] Inventor: Prem Nath, Rochester, Mich.
[73] Assignee: Energy Conversion Devices, Inc., Troy, Mich.
[21] Appl. No.: 448,139
[22] Filed: Dec. 9, 1982
[51] Int. Cl.[4] .............................................. B05D 3/06
[52] U.S. Cl. ........................................ 427/39; 427/40
[58] Field of Search ............................ 427/39, 38, 40; 118/723

[56] References Cited

U.S. PATENT DOCUMENTS 4,170,662 10/1979 Weiss et al. ........................... 427/38
4,336,277 6/1982 Bunshah et al. ...................... 427/38
4,342,631 8/1982 White et al. ....................... 427/39 X Primary Examiner—Evan K. Lawrence
Attorney, Agent, or Firm—Marvin S. Siskind

[57] ABSTRACT

A method of and apparatus for depositing metallic oxide coatings that are highly electrically transmissive and highly electrically conductive onto a substrate. An r.f. signal is employed to develop an ionized plasma of metal and oxygen atoms, the plasma being adapted for deposition onto a large area substrate which preferably includes semiconductor layers thereon. The method and apparatus are particularly adapted for the improved deposition of transmissive and conductive coatings which include low melting point metals onto the surface of plastic, glass or metallic substrates. The deposition may be accomplished in either a continuous or batch process mode.

13 Claims, 4 Drawing Figures

METHOD OF DEPOSITING A HIGHLY CONDUCTIVE, HIGHLY TRANSMISSIVE FILM

FIELD OF THE INVENTION

The present invention relates generally to methods of depositing thin, highly light transmissive, highly electrically conductive films, and more particularly, to processes for efficiently depositing such a film onto a substrate as a step in the production of semiconductor devices.

BACKGROUND OF THE INVENTION

This invention, in one preferred embodiment, relates to an improved method of and apparatus for depositing a thin, highly electrically conductive, highly light transmissive, low melting point metal oxide film onto the surface of an amorphous semiconductor material to manufacture a photovoltaic device. Other preferred embodiments, disclosed herein, deal with the deposition of low melting point metal oxide films onto the surface of metal, glass and/or plastic substrates.

Recently, considerable efforts have been made to develop systems for depositing amorphous semiconductor alloys, each of which can encompass relatively large areas, and which can be doped to form p-type and n-type materials for the production of p-i-n and other type devices which are, in operation in photovoltaic and other applications, substantially equivalent to their crystalline counterparts.

It is now possible to prepare amorphous silicon alloys by glow discharge techniques that have (1) acceptable concentrations of localized states in the energy gaps thereof, and (2) provide high quality electronic properties. This technique is fully described in U.S. Pat. No. 4,226,898, Amorphous Semiconductors Equivalent To Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized defect states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc). The tandem cell device has two or more cells with the light directed serially through each cell, with a large band gap material followed by one or more smaller band gap materials to absorb the light passed through the preceeding cell or layer.

It is of great commercial importance to be able to mass produce photovoltaic devices. Unlike crystalline silicon which is limited to batch processing for the manufacture of solar cells, amorphous silicon alloys can now be deposited in multipe layers over large area substrates to form solar cells in a high volume, continuous processing system. Continuous processing systems of this kind are disclosed, for example, in pending patent applications: Ser. No. 151,301, filed May 19, 1980 for A Method Of Making P-Doped Silicon Films and Devices Made Therefrom; Ser. No. 244,386, filed Mar. 16, 1981 for Continuous Systems For Depositing Amorphous Semiconductor Material: Ser. No. 240,493, filed Mar. 16, 1981 for Continuous Amrophous Solar Cell Production System; Ser. No. 306,146, filed Sept. 28, 1981 for Multiple Chamber Deposition And Isolation System and Method; and Ser. No. 359,825, filed Mar. 19, 1982 for Method and Apparatus For Continuously Producing Tandem Amorphous Photovoltaic Cells. As disclosed in these applications, a substrate formed from stainless steel, for example, may be continuously advanced through a succession of deposition chambers, wherein each chamber is dedictated to the deposition of a specific material.

It is now also possible to produce amorphous semiconductor devices by a layering or clustering technique in which at least one density of states reducing element and band gap adjusting element is introduced without deleteriously affecting the electrical properties of the alloys. Such processes are disclosed in copending U.S. patent application Ser. No. 422,155 filed Sept. 23, 1982, entitled "Compositionally Varied Materials and Method For Synthesizing the Materials", Stanford R. Ovshinsky; and U.S. patent application Ser. No. 442,895, filed Nov. 19, 1982, entitled "Optimized Doped And Band Gap Adjusted Photoresponsive Amorphous Alloys And Devices", Stanford R. Ovshinsky and Masatsugu Izu.

Following the deposition of the semiconductor alloy layers, a further deposition process may be performed either in a separate environment or as a part of a continuous process. In this step, a thin, transparent or semi-transparent film of electrically-conductive, light transmissive material such as TCO (transparent conductive oxide) of, for example, an alloy of indium, tin, and oxygen (ITO) is added. It is the process of and apparatus for depositing such a thin conductive, transmissive film atop a body of semiconductor material to which the present invention is primarily directed.

The deposition of such thin, electrically-conductive films which are also highly light transmissive in the visible range, has a variety of other important optical and electrical applications. These films may be used, inter alia, as: antistatic coatings; electrodes in photoconductor storage devices; liquid crystal and electrochromic displays; photothermal absorption devices; and active and passive layers in photovoltaic devices.

At the present time, thin transparent, conductive metal oxide coatings, used for the purposes outlined hereinabove, commonly comprise: tin oxide materials such as $SnO_2$ and $SnO_2$ doped with antimony or other elements; $In_2O_3$ and $In_2O_3$ doped with tin or other elements; or cadmium oxygen materials such as CdO and cadmium oxygen doped with tin. Note however, such materials as $IN_2O_3$, $SnO_2$ and ZnO are regarded as electrical insulators unless combined with a dopant, and/or formed in a manner which develops a large number of oxygen vacancies. While tin is commonly used to dope indium oxide, other metals, such as cadmium, bismuth and molybdenum may also be employed. Similarly, while antimony is commonly used to dope tin dioxide, metals such as cadmium, molybdenum and indium may also be employed.

The above materials, with tin as a dopant for the indium oxide and antimony as a dopant for the tin dioxide and having indices of refraction which minimize reflection, are particularly well suited for use as thin, conductive, transmissive films on semiconductor materials. This is true when they deposited in about 550 angstrom thicknesses which optimizes their "optical thickness".

Many fabrication processes have been employed to produce the high quality thin, transparent, conductive coatings discussed supra. A first production technique is a variant of a sputtering process in which d.c. or r.f. signals bombard metal-oxide targets and, thereby, eject the metal-oxide material of the targets for deposition onto a substrate. In a variation thereof, d.c. or r.f. sputtering signals are used with metal targets. This is accompanied by a post-ejection reaction in oxygen to create the material for deposition, the reaction occuring in a plasma generated by the sputtering signal. However, the foregoing processes involve high electrical and kinetic energies, relatively slow rates of deposition, and require post-deposition heating.

Another class of prior art fabrication processes involve the evaporation of a metal into the vapor zone of a vacuumized chamber for reaction of the metal with oxygen, the reaction being activated and enhanced by a plasma. This process is (1) disclosed by U.S. Pat. No. 4,336,277, filed Sept. 29, 1980; (2) described by P. Nath and R. F. Bunshah in a publication entitled "Preparation of $In_2O_3$ and Tin-Doped $In_2O_3$ Films By A Novel Activated Reactive Evaporation Technique", published in *THIN SOLID FILMS*, Vol 69 (1980); and (3) taught by P. Nath et al in a paper entitled "Electrical And Optical Properties Of $In_2O_3$: Sn Films Prepared By Activated Reactive Evaportion, published in *THIN SOLID FILMS*, Vol. 72 (1980). As taught by the foregoing, resistive heating is employed to evaporate the metal and an electron beam with a thermionic emitter is employed to generate the plasma. Pressure, in the range of $10^{-4}$ torr, is required to provide a sufficient number of metal and gas atoms colliding with the electrons to accomplish the metal-oxygen reaction. Further, it is essential that (1) an inert gas such as argon be introduced within the plasma zone to aid in the ionization of the oxygen atoms, and (2) that a magnetic field be employed to move the electrons through the zone in a helical path for increasing the length of time the electrons remain in the zone, thereby increasing the number of possible electron collisions with oxygen and metal atoms.

In summary of the prior art fabrication processes discussed hereinabove: (1) while the deposition of ultra-thin noble metals by evaporation or sputtering processes can provide a film exhibiting excellent electrical properties, the film lacks the requisite light transmissivity in the visible range; (2) the deposition of thin films by said fabrication processes may additionally require post-deposition oxidation by heating in oxygen; (3) the deposition of thin films by processes such as chemical vapor deposition, (deposition from a heated chemical vapor which typically includes a metal halide and $H_2O$ vapor) requires elevated temperatures and includes the inherent, corrosive effects of halides, high stresses in the deposited film and impurities from the deposition atmosphere; and (4) the deposition of thin films comprising organometallics is costly.

The improved method of and apparatus for depositing thin, light transmissive, electrically-conductive coatings onto the surface of a substrate employs r.f. power to form the plasma from process gases introduced into a deposition chamber. The r.f. signal is particularly advantageous because the high frequency increases the number of metal atom-oxygen atom collisions necessary to generate an ionized plasma and the collision occurs at lower pressure than was possible with the methods and apparatus discussed supra.

The deposition process and apparatus described herein provides highly electrically conductive films which are highly transmissive in the visible range, formed of $In_2O_3$ doped with tin, $SnO_2$ doped with antimony, and of ZnO material. The results of tests preformed on these materials demonstrate the applicability of the process and apparatus to amorphous photovoltaic devices and crystalline photovoltaic devices which include a substrate, irrespective of whether that substrate is glass, metal or a synthetic plastic resin. The deposition rates which have been acheived are relatively high and the required substrate temperatures which have been achieved are relatively low.

SUMMARY OF THE INVENTION

In accordance with the instant invention, there is disclosed a method of depositing onto a substrate, a thin film that is light transmissive in the visible range and electrically conductive. The method includes the steps of: vacuumizing a chamber, supporting a substrate in the chamber; providing a source of metallic material; evaporting a metallic material in the chamber for producing a metallic vapor in the zone between the substrate and the source of metallic material; introducing oxygen gas into the zone; disposing an r.f. powered cathode adjacent the source of metallic material; and energizing the cathode to develop an ionized plasma from the oxygen and metallic atoms, whereby a metal oxide film is deposited onto the substrate.

The frequency of the rf signal is preferably about 13.56 megahertz, the pressure of the oxygen gas introduced into the zone is preferably about $10^{-2}$ to $10^{-4}$ torr. The substrate may be (1) stainless steel, aluminum or like conductive metal; (2) glass; or (3) a sythetic plastic resin.

The material which is evaporated may include (1) indium, with the method including the additional step of heating the substrate to a temperature of about 150°-300° C.; (2) tin, with the method including the additional step of heating the substrate to a temperature of about 200°-300° C.; (3) zinc, with the substrate being maintained at about room temperature during the deposition of the film.

The apparatus for depositing the thin, light transmissive, electrically conductive film onto a substrate includes a vacuum chamber, a resistance heater in the chamber, a source of metallic material disposed for evaporation by the heater and a substrate spaced from the source of metallic material. A vapor zone is formed between the source of metallic material and the substrate. The improvement includes the introduction of oxygen into the vapor zone and an r.f. powered cathode disposed adjacent the source of metallic material for developing an ionized plasma from the oxygen gas and metallic atoms in the vapor zone. The apparatus is thereby adapted to deposit a metal oxide film onto the substrate.

In a preferred embodiment, the substrate is continuously moving during deposition of the conductive, transmissive film. For example, the substrate travels from a pay-off roll of semiconductor material through a deposition chamber in which the conductive, transmissive film is deposited thereonto, and finally it is wound about a take-up roll. Alternatively, the conductive, transmissive film may be applied in a batch process technique in which the substrate is stationarily positioned to receive the conductive, transmissive film. Obviously, the identical process may be employed to deposit te conductive transmissive film onto a glass substrate or a plastic substrate, regardless of whether semiconductor material has been previously applied thereto.

In contrast to prior art processes for depositing thin electrically conductive, light transmissive films atop, for instance, semiconductor layers, the processes and apparatus of the present invention employ r.f. power to form a plasma from the metal and oxygen atoms. The result is a process: (1) exhibiting higher efficiency ionization (at least one order of magnitude greater ionization than is achieved with the electron emitter); (2) which requires only oxygen to be introduced onto the plasma zone, since the ionization is more efficient; (3) capable of operating at much lower substrate temperatures, thereby preventing (a) the crystallization of amorphous semiconductor layers or (b) the melting of plastic substrates; and (4) which is well suited for the uniform deposition of material over large area substrates.

Finally, there is also disclosed herein, a method of uniformly depositing a film onto the surface of a substrate. The film is formed by evaporating material into a vapor zone for ionization into plasma and deposition onto the substrate. The method includes the steps of providing a plurality of sources of the material, spacedly supporting the sources at equal distances from each other and from the substrate, whereby the spacing between the sources and the spacing between the sources and the substrate are such as deposit of film of substantially uniform thickness onto the substrate. In the preferred embodiment, four sources provided, each of the sources disposed approximately 18 inches from the substrate and approximately 11 inches from each other to deposit a film onto a substrate at least 12 inches wide by 12 inches long.

These and other objects and advantages of the present invention will become apparent from the drawings, the detailed description of the preferred embodiments, and the claims which follow.

DETAILED DESCRIPTION OF THE DRAWINGS

I. The Photovoltaic Cell

Figure 1:
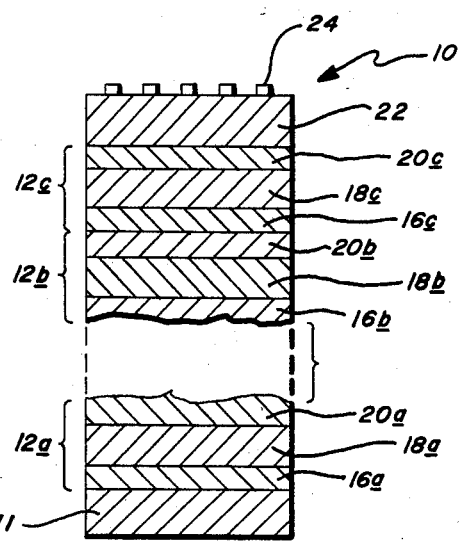
FIG. 1 is a fragmentary, cross-sectional view of a stacked photovoltaic device comprising a plurality of p-i-n type cells, each layer of the cells formed, in the preferred embodiment, from an amorphous semiconductor alloy.

Referring now to the drawings and particularly to FIG. 1, a photovoltaic cell, formed of a plurality of successive p-i-n layers, each of which preferably includes a semiconductor alloy, is shown generally by the reference numeral 10. While the present invention is adapted to be used in conjunction with this type of photovoltaic cell, it is not limited solely to stacked p-i-n photovoltaic cells, but is of equal use with: Schottky or MIS (metal-insulator-semiconductor) type cells; the production of thin-film semiconductor devices; or any device requiring the deposition of a highly conductive, highly transmissive film.

More particularly, FIG. 1 shows a p-i-n type photovoltaic device such as a solar cell made up of individual p-i-n solar cells 12a, 12b and 12c. Below the lowermost cell 12a is a substrate 11 which may be transparent or formed from a metallic material such as stainless steel, aluminum, tantalum, molybdemnum or chrome. Although certain applications may require a thin oxide layer and/or a series of base contacts prior to the application of the amorphous material, for the purpose of this application, the term substrate shall include not only a flexible film but also any elements added thereto by preliminary processing. In alternate preferred embodiments, the substrate may be formed of (1) glass or other such insulating material with an electrically-conductive coating applied onto one surface thereof; or (2) of synthetic plastic resins, with or without the application of conductive coatings thereto.

Each of the cells 12a, 12b and 12c include a semiconductor body containing, in one embodiment, at least a silicon alloy. Each of the semiconductor bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells. Whereas, in the preferred embodiment of the present invention, an amorphous semiconductor alloy, which includes flourine, is used to form each of the layers of the cells 12, the layers could also be formed of crystalline or polycrystalline materals, with or without the addition of flourine. The inventive concepts disclosed herein are applicable to all thin film semiconductor devices, regardless of materials or crystallinity.

Following the depostion of the semiconductor alloy layers, a further deposition step is performed. In this step, a highly electrically-conductive, highly light transmissive coating 22 is added atop the n-type layer 20c, which transparent, electrically-conductive coating may, for example, be a thin, approximately 550 angstrom thick film of indium tin oxide, cadmium stannate, or doped tin oxide. This transparent, electrically-conductive coating 22, which is usually discontinuous, is deposited onto the semiconductor body, when the stacked cell is of sufficiently large surface area, or where the conductivity of a continuous layer of the transparent, electrically-conductive layer 22 is insufficient, so as to shorten the carrier path and increase the conductive efficiency of the cell. Finally, an electrically conductive grid pattern 24 may be added to the top surface of the transparent, electrically-conductive coating 22 with an electrically conductive paste. The detailed description which follows, teaches improved processes of and apparatus for depositing such thin, conductive, transmissive coatings 22 onto a substrate.

II. Apparatus for Depositing the Conductive, Transmissive Film

Figure 2:
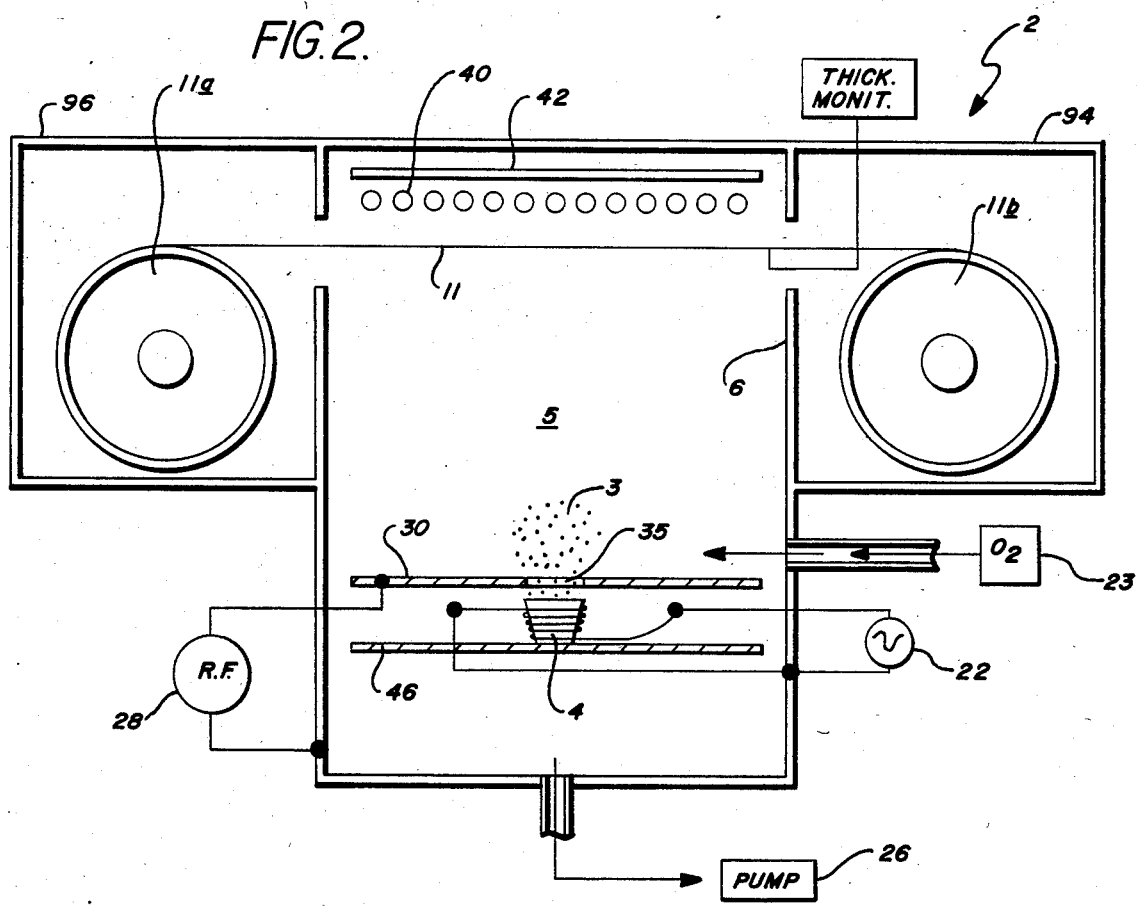
FIG. 2 is a cross-sectional view illustrating the apparatus for depositing the film onto the continuously moving substrate.
Figure 3:
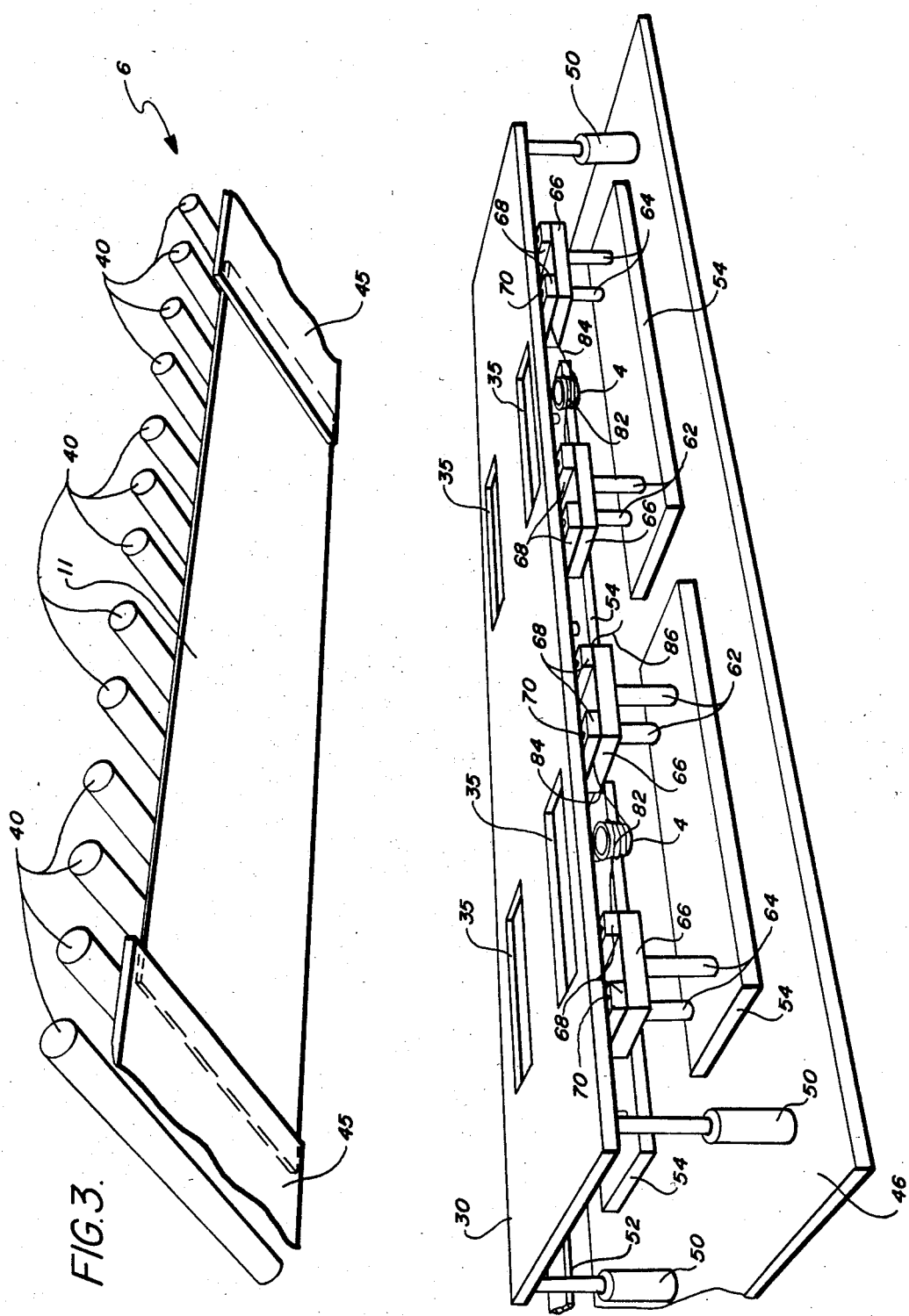
FIG. 3 is a perspective view of the operative components of the deposition apparatus of FIG. 2.

Turning now to FIG. 2, the apparatus, of one preferred embodiment of this invention, for evaporating a low melting point metallic material 3 from a source 4 into the plasma region 5 of a deposition chamber 6 is shown generally by the reference numeral 2. FIG. 2 is a perspective view showing the rear exterior configuration of the deposition apparatus 2 in which a continuous web of substrate material 11 is moved from a supply chamber 96 through the deposition chamber 6 and wound onto a roll in take-up chamber 94. In the embodiment illustrated in FIG. 2, the evaporation of a metal occurs by resistively heating the source 4, usually a crucible or other evaporation boat through which electrical current may be passed. Note that the source 4 of metallic material 3 may also be inductively heated without departing from the spirit or scope of the present invention. In FIG. 3, the crucible 4 is resistively heated by passing electrical current from a power supply 22 through coils wrapped about the crucible 4. Oxygen, from a source 23, adapted to react with the evaporated material 3, is continuously introduced into the deposition chamber 6. Note that in contradistinction to prior art reactive activation processes, the method disclosed herein does not require the introduction of a primary ionizable inert gas to secondarily ionize the oxygen gas. This is because of the more efficient ionization produced by the r.f. power, detailed hereinafter. Conventional pumping apparatus 26 vacuumizes the deposition chamber 6 to preselected pressure conditions.

The reaction between the evaporated metallic material 3 and the oxygen is initiated by an r.f. signal generated by a source of r.f. power 28 which energizes an apertured cathode 30 disposed above the metallic material source 4 in the deposition chamber 6. The r.f. signal developes a plasma in the vapor zone or plasma region 5 into which the metallic material 3 is evaporated. The vapor zone or region 5 is defined as that area between the source of metallic material 4 and a substrate such as 11. It is in this zone 5 that the ionized metal atoms and ionized oxygen atoms and energetic neutral atoms react with each other and with neutral metal and oxygen atoms to form a metal oxide deposit on the substrate 11.

As depicted in FIG. 2, the substrate 11, on which the metal oxide film 22 deposits, may be slowly moved through the deposition chamber 6 from a feed roller 11a to a take-up roller 11b. While the continuous deposition of metal oxide film 22 represents one preferred embodiment of the deposition apparatus, the deposition of the metal oxide film 22 in a batch processing mode represents a second preferred embodiment. In the batch processing mode, the metal oxide film 22 is deposited onto a sheet-like or plate-like substrate which is removed from the chamber 6 once a coating 22 of preselected thickness has been deposited. Infrared lamps 40 and a heat reflector 42 cooperate to raise the temperature of the substrate 11, whether in plate or roll form, to, and maintain the temperature thereof, at a preselected level. In the continuous embodiment of the invention, the rate at which the substrate 11 moves through the deposition chamber 6 depends upon the desired thickness of the metal oxide film 22 to be deposited. A quartz crystal thickness monitor 34 of convention specification, may be employed to gauge the thickness of the metal oxide film 22 during the deposition process. Obviously, the thickness of metal oxide deposited onto the substrate 11 can be adjusted by adjusting the speed of substrate movement through the vapor region 5 of the deposition chamber 6.

In FIG. 3, the deposition chamber 6, shown schemmactically in FIG. 2, is adapted for the depositon of the metal oxide film 22 onto a stationary substrate 11. As illustrated in FIG. 3, a pair of shelves 45 (partially shown) support the substrate 11 in a position elevated above the sources of metallic material 4. Note that in those instances in which metal oxide material is deposited onto a large area substrate 11, a plurality of sources 4 of the metallic material 3 are provided. In the embodiment of FIG. 3, four sources 4 are provided to evaporate the metallic material 3, through four corresponding apertures 35 in the r.f. powered cathode 30. The operation of the four apertures will be discussed in a later section with specific reference to FIG. 4.

In order to more particularly address the batch processing mode of this invention, it is convenient to refer specifically to the features of the depositon chamber 6. Note that, although a substrate sheet 11 is shown resting atop shelves 45, the apparatus is equally adapted for use with the continuous roll of substrate material illustrated and discussed supra with respect to FIG. 2. If used with the continuous roll of substrate material, the shelves 45 would serve as shields to define the length of substrate 11 upon which the metal oxide film could be continuously deposited.

A platform 46, which can be formed of stainless steel, is supported adjacent the lower portion of the deposition chamber 6. In FIG. 2, the platform 46 is shown diagrammatically for the sake of clarity, whereas in FIG. 5 the construction thereof is detailed. Four vertically adjustable legs 50 (only three of which are shown) extend from the platform 46. The legs 50 are fabricated from ceramic material for electrically insulating the stainless steel cathode 30, which they support, from the stainless steel platform 46. The platform 46 may further be provided with holes 52 along the back end thereof for fluidic intercommunication of portions of the deposition chamber 6 above and below the platform 46.

A plurality of substantially identical bases 54 are spacedly affixed to the platform 46. In the preferred embodiment, four equally spaced platforms are provided, however, the number and spacing of the platforms is dependent upon the size and configuration of the substrate upon which the metal oxide film 22 is to be deposited. This will become more clear from the description of FIG. 4 wherein the uniformity of deposition is discussed.

Each of the bases 54 includes a set of electrically insulating ceramic pillars 62 and a set of electrically conductive pillars 64. Associated with each set of pillars, 62 and 64, is a connecting block 66, preferably formed of copper; a pair of clamps 68, preferably formed of copper; and a plurality of screws 20. The crucible 4, or other like source, with a tungsten coil 82 wound thereabout, is suspended between the clamping apparatus of each of the bases 54. More particularly, one end of a first braided copper lead 84 is attached to one end of the tungsten coil 82, while the other end of each copper lead 84 is sandwiched between a clamping element 68 and the connector block 66. A second braided copper lead 86 is likewise sandwiched between a clamping element 68 and the opposite connector block 66. In this manner power from the electrical power supply 22, illustrated in and previously discussed with reference to FIG. 2, is received by the tungsten coil 82. Note that the side of the crucible 4 opposite the "hot"

side is grounded because the conductive pillars 64 to which the leads 84 are secured are grounded.

In operation, the crucibles 4 are resistively heated by the power supply 22, thereby intiating evaporation of the metallic material 3 therefrom. The evaporated metallic material 3 passes through the openings or apertures 35 formed in the cathode 30 and into the deposition region 5 of the deposition chamber 6. The r.f. power products an ionized plasma in the deposition region 5 from the oxygen gas 23 introduced thereonto and the metallic material 3 evaported thereinto. The ionized metal oxide is then deposited onto the surface of the substrate 11 disposed thereabove.

As already indicated, the only modification in the details of the deposition chamber 6 in FIG. 5, required to adapt said chamber for the continuous deposition of the thin, transmissive, conductive film onto the moving substrate, relates to the substrate supply and take-up apparatus.

Note, however, that the presence of the substrate supply chamber 94 and of the substrate take-up chamber 96 does not interfere with the batch process mode of operation. Rotation of the supply roll 11a in chamber 94 and take-up roll 11b in chamber 96 are implemented in a conventional manner using a servomotor-clutch-belt gear arrangement. The supply roll 11a and take-up roll 11b are housed in supply chamber 94 and take-up chamber 96, respectively; with the speed of roll rotation adjustable to (1) move the substrate at a preselected rate and (2) to accurately tension the substrate.

Figure 4:
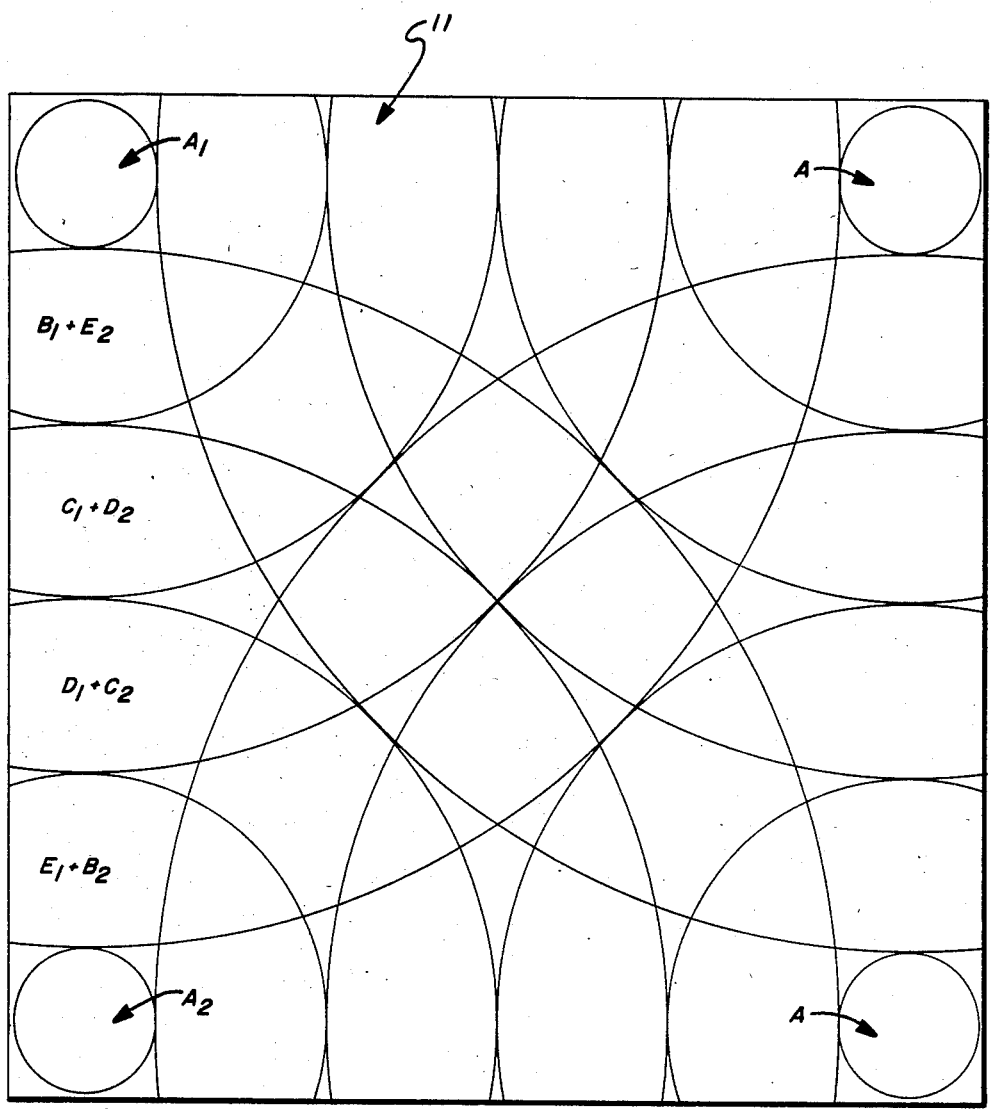
FIG. 4 is a top plan view illustrating the manner in which the evaporated metallic material from the four cathode apertures cooperate to uniformly blanket the surface of a substrate.

Finally, turning to FIG. 4, a plate-like substrate 11 is illustrated. Deposited onto one surface of the substrate is the thin film 22 of transmissive, conductive metal oxide material. In order that the film deposited onto the substrate surface be of substantially uniform thickness, a plurality of sources of metallic material are provided in the deposition chamber 6. In the preferred embodiment, four sources of material, each preferably disposed about eighteen inches below the substrate 11 and equally spaced about eleven inches from one another are provided. It has been found that with the foregoing spacial relationship of metallic material sources relative to the substrate and relative to each adjacent source, the metallic film 22 is uniformly deposited onto the substrate. Although, each of the regions has deposited thereon approximately the same amount of metal oxide material, the regions vary in the amount of material contributed from each of the four sources. More particularly, the ionized metal-oxide from the vapor zone 5 is deposited onto the surface of the substrate plate 11 in regions. These regions vary in thickness of film deposited (from an individual one of the sources) from circular regions A which directly overlie each of the sources 4; to first ring-like regions B which are radially removed from circular regions A; to second ring-like regions C which are radially removed from regions B; to third ring-like regions D which are radially removed from regions C; to fourth ring-like regions E which are radially removed from regions D. As the radial distance from a source is increased, the thickness of material deposited from that source decreases. However, the net affect is that the contributions form all of the sources combine to provide a uniform film thickness upon the substrate plate 11. For example, as between source regions $A_1$ and $A_2$: $A_1$; $B_1+E_2$; $C_1+D_2$; $D_1+C_2$; $E_1+B_2$ and $A_2$ combine to deposit a uniform thickness of material on all regions.

II. TEST RESULTS

A. EXAMPLE I

Numerous tests were performed with indium and tin compositions in order to form an $In_2O_3$—Sn doped film. The indium-tin alloys were formed by melting indium in a vacuum and then quenching. The ratio between the weight of indium divided by indium's atomic weight and the weight of tin divided by tin's atomic weight, was 85/15. Many other compositions were tested, ranging from 100% indium to indium with 50% tin. In these tests, the substrates were both stationary and made of glass; a vaccum of about $10^{-5}$ torr was established before the introduction of oxygen; the metal source to substrate distance was about 18 inches; the frequency of r.f. signal was 13.56 megahertz; and r.f. power was about 100 watts.

It was determined that with a substrate temperature of about 150° C.-300° C., a maximum oxygen pressure during deposition of about $6 \times 10^{-3}$ torr, and a deposition rate from about 500 to about 700 angstroms per minute, a film having a thickness of approximately 1,000 angstroms could be obtained which would provide a sheet resistance of about 10-15 ohms per square and a transmission (integrated average percent from about 4,000 angstroms to 8,000 angstroms) of greater than 90%. This is summarized in the table below.

| Deposition Parameters | |
| --- | --- |
| Starting Material Ratio | Composition of Choice |
| Substrate Temperature | 150° C.-300° C. |
| Substrate | Glass - dimensions greater than 1 ft. by 1 ft. |
| Maximum O$_2$ Pressure | $10^{-2}$ to $10^{-4}$ torr |
| Rate of Deposition | 100-700 angstroms/min. |
| Results | |
| Sheet Resistance (at approximately 1000 angstroms thickness) | 2-100 ohms/square |
| Transmission | greater than 90% |
| A specific example from these tests is as follows: | |
| Starting Material Ratio | 85 atomic % In/15 atomic % Sn |
| Substrate Temperature | 275° C. |
| Substrate | Glass - dimensions greater than 1 ft. by 1 ft. |
| O$_2$ Pressure | $4.5 \times 10^{-3}$ torr |
| Rate of Deposition | 620 angstroms/min. |
| Sheet Resistance (at approximately 1,200 angstroms thickness) | 14 ohms/square |
| Transmission | greater than 90% |

B. EXAMPLE 2

The following example was performed on a PIN photovoltaic cell, such as the one illustrated in FIG. 1, with a starting vacuum of about $10^{-5}$ torr and the same net r.f. power, r.f. frequency, and source to substrate distance as above. Note that because of the substrate, the sheet resistance and transmissivity were not measured.

| | |
| --- | --- |
| Starting Material Ratio | 85 atomic % In/15 atomic % Sn |
| Substrate Temperature | 170° C. |
| O$_2$ Pressure | $2.5 \times 10^{-3}$ |
| Substrate | PIN (on stainless steel) amorphous photovoltaic cell-16 inches by 18 inches |

| | |
|---|---|
| Rate of Deposition | 340 angstroms/min. |
| Thickness | 650 angstroms |

C. EXAMPLE 3

The following example employed tin and antimony as the metallic material which is evaporated. As previously, the starting vacuum was about $10^{-5}$ torr; the net r.f. power was about 100 watts, the r.f. frequency was 13.56 megahertz; and the source to substrate distance was about 18 inches.

| | |
|---|---|
| Starting Material Ratio | 90 atomic % Sn/10 atomic % Sb |
| Substrate temperature | 250° C. |
| Substrate | Glass - 16 inches by 18 inches |
| $O_2$ Pressure | $2.5 \times 10^{-3}$ torr |
| Rate of Deposition | 410 angstroms/min. |
| Sheet Resistance (at about 1500 angstroms thickness) | 80 ohms/square |
| Transmission | greater than 90% |

The following is a chart of what typical results of tin-antimony compounds, at the initial vacuum pressures, r.f. power, r.f. frequency, and source to substrate distance, described supra.

| | |
|---|---|
| Starting Material Ratio | 90 atomic % Sn/10 atomic % Sb |
| Substrate Temperature | 200° C.-300° C. |
| Substrate | Glass |
| Maximum $O_2$ Pressure | $6 \times 10^{-3}$ torr |
| Rate of Deposition | 400–600 angstroms/min. |
| Sheet Resistance (at approximately 1000 angstroms thickness) | 50–70 ohms/square |
| Transmission | greater than 90% |

D. EXAMPLE 4

The following example was performed with zinc as the sole evaporated material, with an initial vacuum pressure of $10^{-5}$ torr, a net r.f. power of about 100 watts, an r.f. frequency of 13.56 megahertz, and a source to substrate distance of about 18 inches.

| | |
|---|---|
| Substrate Temperature | Room - i.e. about 30° C. |
| Substrate | Glass - 16 inches by 18 inches |
| $O_2$ Pressure | $3 \times 10^{-5}$ torr |
| Rate of Deposition | 520 angstroms/min. |
| Sheet Resistance (at about 1000 angstroms thickness) | 80 ohms/square |
| Transmission | greater than 90% |

The foregoing example was also tested, because of its ability to be performed at low temperature, on a polyester substrate. However, it also provides satisfactory results on a variety of other substrates, such as stainless steel substrate with amorphous and crystalline semiconductor layers deposited thereon.

It should be understood that the present invention is not limited to the precise structures and methods of the illustrated embodiments. It is intended that the foregoing description of the presently preferred embodiments be regarded as illustration rather than as a limitation of the present invention. It is the following claims, including all equivalents which are intended to define the scope of this invention.

What is claimed is:

1. An improved method of depositing a thin, light transmissive, electrically conductive film onto a substrate said method consisting essentially of the steps of:
   vacuumizing a chamber;
   supporting an electrically conductive substrate in the chamber;
   providing a source of metallic material, the oxide of said metallic material being conductive when deposited as a film by the subsequent process steps;
   evaporating the metallic material in the vacuumized chamber for producing a metallic vapor in the zone formed between the substrate and the source of metallic material;
   introducing oxygen gas into the zone;
   disposing an r.f. powered cathode adjacent the source of metallic material; and
   energizing the cathode to develop an ionized plasma from the oxygen gas atoms introduced into the zone and the metallic atoms evaporated into the zone, whereby a conductive metal oxide film is deposited onto the substrate.

2. A method as in claim 1, wherein the metal material has a melting point of less than 450° C.

3. A method as in claim 2, wherein the metallic material is selected from the group consisting of indium, tin, cadmium, zinc and mixtures thereof.

4. A method as in claim 1, including the further step of heating the substrate to 150°-300° C. and evaporating an indium-tin compound in the chamber, whereby indium-tin oxide is deposited onto the surface of the substrate.

5. A method as in claim 4 wherein the r.f. power source is energized to a frequency of about 13.56 megahertz.

6. A method as in claim 4, wherein the pressure within the chamber is maintained at about $10^{-2}$ to $10^{-4}$ torr.

7. A method as in claim 1, wherein the metallic material is zinc and the substrate is maintained at room temperature.

8. A method as in claim 1, wherein the metallic material is indium and the substrate is heated to a temperature of less than about 300° C.

9. A method as in claim 1, including the additional step of depositing the metallic oxide film onto a continuously moving substrate.

10. A method as in claim 1, wherein the substrate includes a semiconductor body onto which the metallic oxide film is deposited.

11. A method as in claim 10, wherein the semiconductor body comprises a plurality of amorphous semiconductor layers.

12. An improved method of depositing a thin, light transmissive, electrically conductive film onto a substrate, said method including the steps of:
   vacuumizing a chamber;
   supporting a substrate in the chamber;
   heating the substrate to a temperature of less than about 300° C.;
   providing a source of indium;
   evaporating the indium in the vacuumized chamber for producing an indium vapor in the zone formed between the substrate and the source of indium;

introducing oxygen gas into the zone;

disposing an r.f. powered cathode adjacent the source of indium; and energizing the cathode to develop an ionized plasma from the ozygen gas atoms introduced into the zone and the indium atoms evaporated into the zone, whereby an indium oxide film is deposited onto the substrate.

13. An improved method of depositing a thin, light transmissive, electrically conductive film onto a substrate, said method including the steps of:

vacuumizing a chamber;

supporting a substrate in the chamber;

heating the substrate to 150°–300° C.;

providing a source of an indium-tin compound in the vacuumized chamber for producing an indium-tin vapor in the zone formed between the substrate and the source of the indium-tin compound;

introducing oxygen gas into the zone;

disposing an r.f. powered cathode adjacent the source of the indium-tin compound and energizing the cathode to develop an ionized plasma from the oxygen gas atoms introduced into the zone and the indium atoms and tin atoms evaporated into the zone, whereby an indium-tin oxide film is deposited onto the substrate.

* * * * *